United States Patent [19]

Collins

[11] Patent Number: 4,730,159

[45] Date of Patent: Mar. 8, 1988

[54] PROGRAMMABLE BED-OF-NAILS TEST ACCESS JIGS

[75] Inventor: Roderick J. W. Collins, Maldon, England

[73] Assignee: The General Electric Company P.L.C., London, England

[21] Appl. No.: 744,461

[22] Filed: Jun. 12, 1985

[30] Foreign Application Priority Data

Jun. 21, 1984 [GB] United Kingdom ............... 8415874

[51] Int. Cl.⁴ ............................................. G01R 1/073
[52] U.S. Cl. .............................. 324/158 F; 324/73 PC
[58] Field of Search ............ 324/158 F, 158 P, 73 PC

[56] References Cited

U.S. PATENT DOCUMENTS

| | | | |
|---|---|---|---|
| 3,714,572 | 1/1973 | Ham et al. | 324/158 F |
| 4,138,643 | 2/1979 | Beck et al. | 324/158 P |
| 4,342,334 | 8/1982 | Stangroom | 137/625.48 |
| 4,532,853 | 8/1985 | Stangroom | 91/165 |
| 4,560,871 | 12/1985 | Bowman et al. | 251/57 X |

FOREIGN PATENT DOCUMENTS 1570234  7/1980  United Kingdom .

Primary Examiner—Reinhard J. Eisenzopf
Assistant Examiner—Stephen M. Baker
Attorney, Agent, or Firm—Spencer & Frank

[57] ABSTRACT

Bed-of-nails test access jigs are commonly used to effect the required electrical connections between an electronic circuit constructed on a printed circuit board (PCB) and the automatic (electrical) test equipment (ATE) used to carry out their testing. "Fixed" bed-of-nails jigs have a number of disadvantages that can be overcome by the use of a programmable bed-of-nails jig, but the present-day programmable systems using apertured masks, or secondary pin frames, to set up a particular pin configuration, do not provide a good solution where the pin configuration has to be changed during the testing sequence. The invention suggests a design employing individually-controlled pin control mechanisms such that from a total field of pins individual pins can be programmed to make contact with the PCB. It enables the pin actuating mechanism to fit into the space available by proposing the use of miniature clutch, or valve, mechanisms involving the utilization of an electro rheological fluid. The inventive bed-of-nails device is thus one in which there are individual pin control mechanisms, functionally separate from the control means of any other pin, that utilize either the valve- or the clutch-forming abilities of an electro rheological fluid.

19 Claims, 9 Drawing Figures

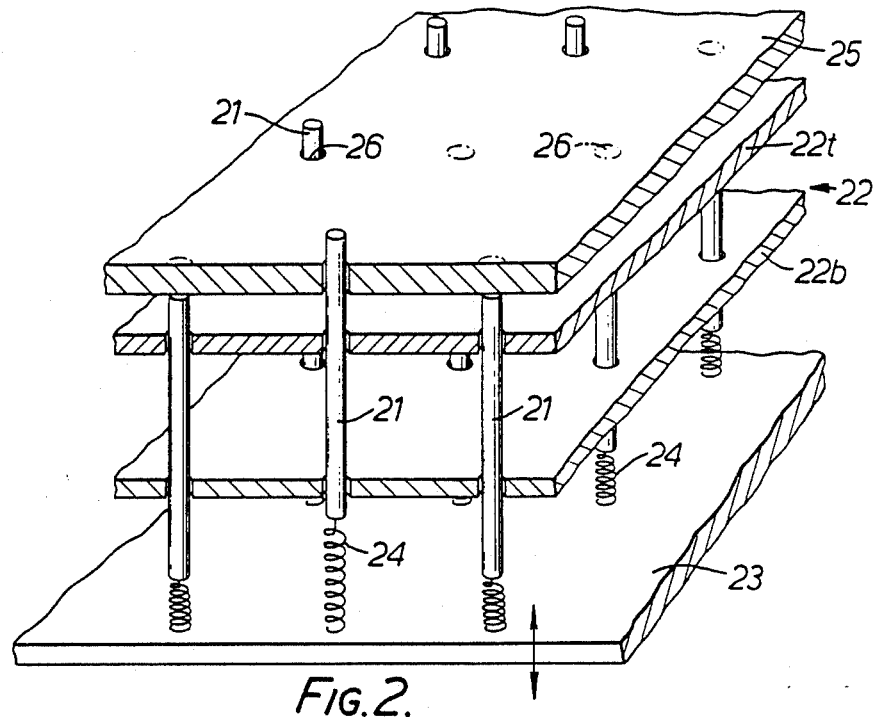
FIG.2.
(PRIOR ART)
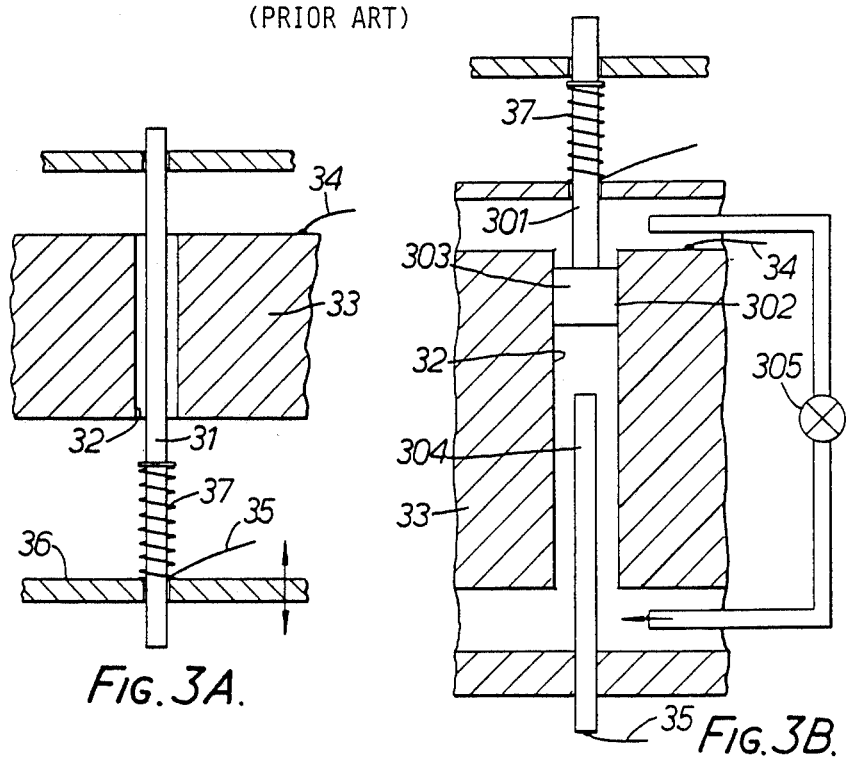
FIG.3A.
FIG.3B.

PROGRAMMABLE BED-OF-NAILS TEST ACCESS JIGS

BACKGROUND OF THE INVENTION

1. Field of the Invention

This invention concerns bed-of-nails test access jigs, and relates in particular to such jigs that are programmable, and so can be completely re-configured automatically.

2. Description of the Prior Art

Bed-of-nails test access jigs are commonly used to effect the required electrical connections between an electronic circuit constructed on a printed circuit board (PCB) and the automatic (electrical) test equipment (ATE) used to carry out the testing. PCBs are by now a well-known feature of electronic equipment, enabling the many components of a modern electronic circuit to be both supported and interconnected without using a jumble of wiring resembling a plate of spaghetti. A typical PCB comprises a board constructed from some insulating material such as a glass-fibre-reinforced epoxy resin, commonly up to about 18×18 in (45×45 cm) square, on which are formed, by a "printing" technique, a multitude of copper tracks eventually forming the electrical connections between the components to be mounted on the board (the leads of these components pass through holes in the board and are soldered to the tracks). During testing of a PCB, various points on the circuit—usually pads designed into the board's tracks—are required to be connected to the ATE. Most conveniently these connections are made via a bed-of-nails jig which contacts each of the required points by means of a spring-loaded pin. The testing may concern the "bare" board, without any components on it (looking for track continuity, and so on), or it may concern a "loaded" board, carrying the components, either in its "off", or non-powered, state, or—especially—in either of its "on", or powered, states (static, with no signal input, or dynamic with normal signal input; in this latter case the test actually examines whether the completed circuit is functioning correctly).

A bed-of-nails access jig consists of a number of fixed-position spring-loaded pins (the "nails") supported within a frame (the "bed") and connected to the ATE via individual cables. Most commonly, each particular bed-of-nails jig is specially designed and manufactured—with an appropriate number of pins suitably positioned—to carry out specific tests on a particular type of PCB, and from this it follows that to undertake a differing series of tests, and/or to conduct these tests on a different circuit, requires a different bed-of-nails jig design. Making such jigs is a well-established Art, and merely requires that some convenient framework be made which will hold the spring-loaded pins in the required positions.

The "fixed" pin bed-of-nails jig as described above has a number of disadvantages. For example, there is the need specially to design, manufacture, store and maintain one jig for each type of circuit board and/or each series of tests to be conducted. Further, the use of this particular technique is restricted in its application to some particular types of testing. Thus, when in contact with the PCB, each pin and its associated cable places a load on the circuit under test; the pin cables can, by inductive or capacitive coupling between each other, couple extraneous electrical signals to various parts of the circuit under test such that it no longer performs as it would perform if it were not connected to the access jig.

All these problems can be overcome by the use of a programmable bed-of-nails jig. Such a device would consist of a field of pins which was at least as big as the largest PCB to be tested. Individual pins would be positioned in the field such that there was one pin for every required contact position. Every pin would be automatically controlled such that it could be individually programmed to be "up" (activated, and capable of contacting the board) or "down" (de-activated, and incapable of contacting the board).

In order to meet these requirements such a device would, ideally, be capable of having a pin bed at least 18 in×18 in (45×45 cm), with the pin centres falling on a 0.025 in (0.635 mm) matrix (the requirement for having pins on such a matrix stems from the fact that PCBs are conventionally laid out on a corresponding grid). Unfortunately, within the current state of the Art such spacing cannot be achieved. Both the pin itself—which must be strong enough to withstand the force applied between it and the PCB—and the pin-activating mechanism have to be contained within the small space available, and while it might be possible to make the pins thin enough it has not so far proved possible to make their activating mechanisms so small.

One currently available system which approaches the ideal requirements consists of a field of spring-loaded pins mounted in a framework such that the pins lie on a suitable matrix (this can, in the state of the Art, be as small as 0.05 in, or 1.27 mm) above an actuating plate. On raising the actuating plate all the pins have a "raising" force applied to them via their individual springs. The required pin selection is achieved by the use of a blanking plate which is inserted above the pins (between the pin bed and the PCB under test). This plate is pre-drilled with holes such that only the required pins are allowed to rise (through the holes) into contact with the PCB, whilst the non-required pins are blocked off, and so are held in their lowered position.

An alternative approach employs the same basic mechanism but uses, instead of the apertured blanking plate, a second frame containing extension pins only in the required positions (no subsequent blanking plate is required since the effective length of the selected pins is significantly longer than that of the non-selected pins). Whilst more cumbersome than the simple blanking plate device, this extension pin technique does allow access to points on the PCB which do not line up with the pin matrix, for the required extension pins can be held in their frame at some slight angle such that, in the vertical plane, the head of the extension pin is displaced from the line of the main actuating pin.

The present-day programmable systems do provide a solution to the problems of the specially-built pin jig where the same pin configuration is required throughout the test sequence. They do not, however, provide a good solution where the pin configuration has to be changed during the testing sequence.

Alternative methods of achieving programmable access include the use of x-y coordinate probes. A probe carrier is driven automatically to the required position, the probe head being moved into contact with the PCB in a similar manner to the contact made by a bed-of-nails pin. To achieve multiple, simultaneous, probing, a number of separately-driven probe heads must be used. The disadvantages of this system lie in its speed of operation (which is too slow), the minimum spacing between two points which can be accessed simultaneously (which is too large), and the number of such probes which can be used at any one time (which is too small; normally such systems utilise either a single-probe or two-probe arrangement, although it is possible to design a machine which has up to five independently-controlled probe carriers).

One possible real solution lies in the use of individually-controlled pin control mechanisms such that from a total field of pins individual pins can be programmed to make contact with the PCB. This concept is not in itself new, but the design of a suitable pin actuating mechanism which will fit into the space available has previously not been achieved. The invention suggests an improved mechanism which will go some way to solving the problem. Specifically, the invention proposes the use of miniature clutch, or valve, mechanisms involving the utilisation of an Electro Rheological Fluid; it may accordingly be defined as a bed-of-nails device in which there are individual pin control mechanisms that utilise either the valve- or the clutch-forming abilities of an ER fluid.

BRIEF SUMMARY OF THE INVENTIVE CONCEPT

In one aspect, therefore, the invention provides a bed-of-nails assembly for use in a programmable bed-of-nails test access jig, and including a framework, a multiplicity of pins carried by the framework and positioned on a suitable grid, each pin being mounted for longitudinal movement between a first, in contact, position and a second, out of contact, position, pin displacement means associated with each pin, for urging the pin to move between the two positions, and displacement control means associated with each pin, for controlling the pin's movement when urged by the displacement means, wherein:

each pin has its own, individual, displacement control means, functionally separate from the control means of any other pin; and each individual pin displacement control means utilizes the electro rheological effect available from an ER fluid to regulate pin movement.

DETAILED DESCRIPTION OF THE INVENTIVE CONCEPT

The inventive assembly includes a framework, a multiplicity of pins, and pin displacement means. In whole or in part these may take any of the forms used, or suggested for use, for bed-of-nails jigs, and need little detailed comment here. Nevertheless, it seems useful briefly to describe their main features.

The framework is simply a rigid frame in which the pins can be mounted for longitudinal sliding movement. In principle it consists merely of a rectangular base plate of the appropriate size supporting four columns (one at each corner) themselves carrying an apertured upper, guideplate which locates the pins while allowing them to slide up and down.

The multiplicity of pins is sufficient to provide the required number of pins at the required centre-to-centre spacing over the entire board area—if it were possible to place them on a 0.025 in (0.635 mm) matrix over $18 \times 18$ in$^2$ ($45 \times 45$ cm$^2$) this would mean $18 \times 18 \times 1/0.025 \times 1/0.025 = 18 \times 18 \times 40 \times 40 = 514,400$ pins! The pins (which term is here used to include any probe-like tip they may carry to make the actual contact with the PCB under test) are conventionally thin rods rather like knitting needles. They can move longitudinally between a first position (usually up), where they are in contact with the PCB, and a second position (usually down), where they are out of contact.

The pin displacement means may be of any sort used, or suggested for use, in the Art. One sort may be a moveable, usually raiseable, platen mechanically linked to the pins by springs such that as it is moved from one position to the other the springs are caused to urge the pins to move also, but if any pin is prevented from so moving then the spring "absorbs" the motion. One example of such a platen-using displacement means the platen is apertured to accommodate the pins, and each spring extends in compression between the platen and a fixed collar on the pin shank. However, a second sort of pin displacement means, which is preferred, has the displacement means in part "combined" with the displacement control means, so that the combination both moves, and controls the movement of, each pin against a restoring force again provided preferably by a spring connecting the pin to a spacially fixed portion of the pin-supporting framework.

Whether the displacement means is of this "combined" type or not, there is still in effect a platen that is moved to move the pins. The means by which this movement is effected can be any suitable such means used or suggested for use in the Art. Typical such means are hydraulic rams and solenoids.

The novelty of the bed-of-nails assembly of the invention may be said to lie in the use of individual, ER-fluid-utilising, displacement control means; as discussed hereinafter the control means can be configured either as a clutch or as a valve. An ER fluid has an electro viscous property and will be further described below.

Electro Rheological Fluids (ER fluids), generally slurries of a non-conducting oil and a polymer associated with absorbed water, have the property that when subjected to an electrical field certain aspects of their physical nature—specifically, their ability to withstand shear forces—are transformed from those of a liquid into those of a solid. If, for example, an ER fluid is disposed within the gap between two parallel, or concentric, vertical metal plates, and an electrical field of about 3K volts per mm is applied across the plates, then either:

(a) there can be no relative vertical movement between the plates until some particular shear force is exceeded, and the ER fluid behaves like a solid binding the two plates together to form a clutch, or (b) if it is attempted to pump the liquid through the gap no liquid flow can take place until some particular pressure is exceeded, and the ER fluid behaves like a solid plug, blocking the gap like a valve.

The magnitude of the "clutch" shear force, or the "valve" pressure, is dependent upon the actual substances used in the slurry, the proportions of the mixture, the level of stress voltage applied and the area of the metal plates. More is said hereinafter about these factors as they relate to the invention.

The physical mechanism by which ER fluids exhibit their effects is a matter of some disagreement within the scientific world. Some believe that the effect is caused by the polymer-absorbed water molecules forming a bridge under voltage stress conditions. A paper by J. E. Strangroom, published by the Institute of Physics (Physics in Technology, Vol. 14, 1983, pages 290 to 296), discusses ER fluids and the "water bridge" theory of operation.

The simplest ER fluid clutch is two plates with the ER fluid between them; when the field is on the fluid "solidifies", locking the plates together and so preventing relative movement until the shear forces involved become too great. Another form is that of a rod (one "plate") sliding within a tube (the other "plate"). It is the latter form that is best employed to utilise the ER fluid clutch mechanism in the invention. The pin to contact the PCB is made a push rod (forming one plate of a cylindrical clutch mechanism) within a tube (a hollow cylinder, forming the other plate, placed concentrically round the rod) with a small gap between the cylinder internal wall and the rod, and this gap is filled with a suitable ER fluid. When a stress voltage is applied, the rod is "locked" to the cylinder, and will follow the motion of the cylinder—i.e., the rod can be moved by moving the cylinder, or any rod motion induced by some force applied directly to the rod can be constrained by holding the cylinder stationary.

The simplest ER fluid valve is a pipe with ER fluid in it and two electrodes spaced across its base; when the field is on the ER fluid "solidifies" in the pipe, preventing any flow of fluid along the pipe. Such a valve can be employed to control pin displacement if the pin is used as a piston which slides in a cylinder fed with an ER fluid, and the fluid feed is controlled by an ER valve. If an ER fluid is pumped into the cylinder then the fluid flow to the cylinder, and hence the movement of the piston within the cylinder, can be constrained by closing the ER valve.

The clutch mechanism type of system is presently preferred for the pin displacement control means, and accordingly the remaining description is, for the most part, concerned with the use of such clutch mechanisms rather than of valve mechanisms.

The basic clutch mechanism consists of a cylindrical, metal push-rod—the pin—passing through a bore hole in a metal block—the cylinder, The dimensions of the rod and bore hole are, preferably, such that there exists a gap of 0.02 in (0.5 mm) between the rod and the bore wall for the complete circumference of the rod. In operation, this gap is filled with an ER fluid. Electrical connections are taken to the block and the rod (for these double as the plates across which the electrical field is to be applied), and the rod is mechanically connected to the platen by a spring. Any convenient method may be used to raise and lower the platen relative to the block (one such method involves a hydraulic ram). Normally, the rod will follow the motion of the base plate, but when the appropriate voltage (of the order of 1.5 Kv) is applied across the gap the block and rod are "locked" together; within the limits of the shear force obtained, no relative motion takes place. The rod can therefore be programmed to be up or down irrespective of the position of the platen plate, any attempted relative movement of the rod and platen being absorbed by the spring.

The ER fluid clutch consists essentially of two metal surfaces separated by a small gap in which is disposed the ER fluid. In a bed-of-nails device, by the very nature of the application two dimensions of the mechanism, namely breadth and width, must be as small as possible (so that the pins can be as close to each other as possible), but the third dimension (length) is less critical. Commensurate with the needs to have the pin/rod diameter as small as possible and yet to have sufficient strength in the assembly to avoid undue bending of the pins/rods, the latter are conveniently of 0.04 in (1 mm) diameter cylindrical steel. In essence, these are positioned concentrically within a 0.08 in (2 mm) inside diameter tube, thus making a gap of 0.02 in (0.5 mm) between the rod and the cylinder walls. However, in practice, and to allow for mechanical tolerances and any bending of the inner rod, and to maintain the gap to an absolute minimum of 0.012 in (0.3 mm), the tube is 0.084 in (2.1 mm), producing a nominal gap of 0.024 in (0.6 mm). If the gap is smaller than 0.012 in (0.3 mm) electrical breakdown may occur, preventing the ER fluid clutch action taking place.

Setting the working length of the clutch is a matter of compromise between a number of options. Ultimately, the shear force of the clutch (i.e., the force which the clutch will transmit without slipping) must be sufficient to raise and hold the rod against its weight and the friction of the bearings, and to extend (or compress) any spring associated with the need to have a flexible electrical connection to the push rod. Dependent upon the final design details the shear force could also need to be large enough to withstand any back pressure exerted on it by the pressure contact formed by the pin head and the PCB under test. All in all, a shear force of about 2 Newtons (about $2 \times 10^5$ dynes, 0.2 kg wt, 0.45 lbs wt, or 14.4 poundals) is required.

Since the shear force obtained varies directly with the area of the clutch plates (i.e., the length of the pin/rod) and directly, but non-linearly, with the stress voltage, the stronger the reaction obtained from the fluid the shorter the length of the rod and/or the lower the stress voltage needed to obtain the required shear force. Conveniently, any ER fluid which exhibits a shear stress of about at least 6 KPa (6000 Newtons/$m^2$, or about 0.06 kg/$cm^2$, or 0.34 lbs/$in^2$) at a stress voltage of the order of 2.2 Kv per mm can be used. A 6 KPa shear stress would provide a shear force of 2 Newtons with a working length of 4.2 in (about 10.6 cm).

Desirably, the ER fluid used should not be toxic, should not have a high current density characteristic over the intended working temperature range, and should not settle out too easily. Fluid characteristics such as its frequency response and the overall stress force/stress voltage relationship are relatively unimportant. A number of ER fluids are known, and have been proposed for various uses in the literature. The basic concept is outlined in British Patent Specification Nos.: 1,501,635 and 1,570,234, while particular ingredients are described in British Patent Specification Nos.: 2,100,740A and 2,119,392A.

One suitable fluid, produced by Laser Engineering, is a silicone-oil-based fluid, referred to as SIL 200/10CS/4015. It is believed to be Dowe Corning 200 10 centistokes silicone oil having suspended therein 40% by volume of a poly(methylmethacrylate) having a relative humidity of 18%. This fluid exhibits a minimum shear stress of 8.5 KPa (8500 Newtons/$m^2$, or about 0.085 kg/$cm^2$ or 1.2 lbs/$in^2$) at a stress voltage of 2.2 Kv/mm thus requiring a clutch working length of 3.2 in (about 8 cm).

As stated above, the displacement control means can be an ER fluid valve but is preferably an ER fluid clutch. Moreover, in principle the clutch conveniently takes the form of a pin, or rod, moving longitudinally within a cylinder/tube. The details of this clutch mechanism may be realized in a number of ways, depending to some extent on whether—and if so, how—the displacement means is integrated therewith. One such design uses a pin separated into a contact end part and non-contact end part by an insulating portion. A spring is mounted to connect the contact end part to a guideplate forming part of the framework, and provides the required restoring force. The displacement is achieved by moving the clutch cylinder, which is disposed around the non-contact end part. The electrical connection to the pin's contact end, which connection must be capable of carrying relatively high currents (about 0.5 A), and transmitting low voltages (about 200 mv), is made via the spring while the electrical connection to the pin's non-contact end part (which part is one plate of the clutch) is made via a sliding contact, for, because of the high voltage and low current requirements of the ER fluid, it is not necessary to have a low resistance electrical path.

In the design just described the pin is in two parts, each having an electrical connection thereto (one part contacts the PCB, while the other forms the inner plate of the cylindrical clutch mechanism). The purpose of this is to allow the high voltage driving the clutch to be kept away from the PCB and any voltage-sensitive components mounted thereon. The problem lies in the fact that not only must the clutch be activated to move the pin into position, but—as so far described—it must be constantly activated to maintain the pin there. This can be dealt with, and the assembly design considerably simplified, if the pin can be retained in position by some means—preferably purely mechanical—other than the clutch. And such a means may conveniently be the combination of a sideways slideable, insulated, apertured locking plate through which each pin projects and a collar on the pin dimensioned just to pass through the locking plate aperture and positioned on the pin so as to lie on one side of that aperture in the pin-unselected position but on the other in the pin-selected position. By sliding the locking plate sideways all the selected pins will be maintained in the pin-selected (usually raised) position because the collar of each is now out of alignment with the aperture, so preventing the pin being restored (by, say, a spring) to the pin-unselected (usually lowered) position, and by the same token the unselected pins will in like manner be maintained in the pin-unselected position. The considerable advantages of this, or any other, mechanical locking system may be summarised as follows:

(a) The system only requires one connecting wire per pin, this single wire being switched between the jig re-configuration mode (when the wire carries the ER fluid clutch control signal) and the testing mode (when the wire carries the test signals from the PCB under test to the ATE).

(b) The whole of the pin may be constructed from a single metal rod, thus making the manufacture simpler and the pin stronger.

(c) The minimum shear force required between the pin and the clutch cylinder walls (i.e., the shear force of the ER fluid clutch) is reduced. This force is now only required to be large enough to move the pin up and down, and does not have to be sufficient to hold the pin up against the pressure exerted through contact with the PCB. In turn, this allows the stress voltage controlling the ER fluid clutch to be minimised.

(d) Provided the PCB is away from the pin bed while applying the ER fluid control voltage, there is no chance of the high voltage control signals being applied either directly or indirectly to the PCB. This avoids any possibility of damage to the PCB or its components from this source.

The operation of a system using such a mechanical locking arrangement would be as follows:

Starting with all pins lowered (the out-of-contact position), the lock open, and the PCB moved (raised) away from the pin bed:

(i) switch all pin assembly connections to the jig control electronics;
(ii) switch the high level control voltage signal to the actuating platten;
(iii) via the control electronics, switch the low level control signal voltage (preferably earth) to all pins to be raised;
(iv) raise the platen—thus raising all the selected pins by means of the activated ER fluid clutches formed between the platen and the selected pins;
(v) operate the mechanical lock, to lock in the up position all the raised pins (and lock in the down position all the unraised pins);
(vi) switch off the ER fluid control voltage;
(vii) switch the pin connections away from the jig control electronics and to the ATE/Unit Under Test interface;
(viii) lower the PCB such that the raised pins make contact at the required points.

Regardless of whether the ER fluid displacement control means mechanism is a valve or a clutch there must be found some way to retain the ER fluid in place—in a clutch, this means in the gap between the two working surfaces of the clutch. This could be achieved by the use of seals fixed to the pins, but seals good enough to retain the fluid are difficult to implement, and would add considerable friction between the pin and its cylinder. Very preferably, therefore, the entire problem is obviated by immersing the complete assembly in a tank of the ER fluid such that the clutch (or valve) mechanisms are below the level of the fluid but the contact portions of the pins are above it.

In order to position the pins as close together as possible they (and their displacement control means) must be of the smallest possible diameter whilst at the same time being of sufficient strength to withstand the forces involved without undue bending. In a preferred practicable embodiment using a clutch mechanism the pins are of 0.04 in (1 mm) diameter, and the inside diameter of the clutch cylinders is 0.08 in (2.1 mm)—providing a 0.024 in (0.6 mm) (nominal) gap. In a jig using such an arrangement to form the highest density field of pins, the pin centres can be on a pitch of 0.1 in (2.54 mm). This is not as small as could be desired, but is very much better than might hitherto have been thought possible for any fully-programmable jig.

The purpose of the invention is to enable the construction of a high density bed-of-nails jig that is fully programmable in that almost at will any pin or set of pins may be selected to be brought into contact with the PCB under test. The ways in which this overall pin control can be effected range from the simple—perhaps using a calculator-like keyboard to input pin coordinates one after the other, some internal electronics then activating the appropriate displacement control means at the right moment—to the complex—possibly having the entire operation under microprocessor control, the data defining the selected pin(s) being read into memory from tape, disk or even a ROM chip. There is no need here to dwell on the matter, though it may be useful to note that when the assembly is incorporated within a bed-of-nails jig driven by an automatic test equipment the program controlling the latter can easily be expanded to control the assembly as well.

For any style of bed-of-nails access jig the PCB to be tested must be mounted in such a manner that it lines up with the pin field. The most common method of achieving this is to use the edges of the PCB as a reference—the PCB being simply slid into two slides adjustably mounted on the jig framework and spaced by the correct amount. This slide assembly is then lowered onto the pin bed such that there exists a force in the range 1 to 2 Newtons between each pin head and the PCB. The use of a vacuum to suck the PCB down onto the pin bed is the generally-preferred method, because this achieves even pressure contacts over the whole board area. Mounting the PCB onto a programmable bed-of-nails in accordance with the invention would follow these similar, conventional, lines. The use of a slide assembly mounted for some controlled x-y coordinate movement would provide a greater degree of access to be obtained from a given pin field.

The invention extends, of course, to a bed-of-nails test access jig whenever incoporating a bed-of-nails assembly as described and claimed herein.

BRIEF DESCRIPTION OF THE DRAWINGS

Various embodiments of the invention are now described, though by way of illustration only, with reference to the accompanying Drawings in which:

FIG. 2 is a diagrammatic isometric, part cut-away, view of a bed-of-nails jig;

FIGS. 3A and 3B are diagrammatic "elevational" views of, respectively, pin/clutch and pin/valve combinations as might be used in an assembly of the invention;

DETAILED DESCRIPTION OF THE DRAWINGS

Figure 1A:
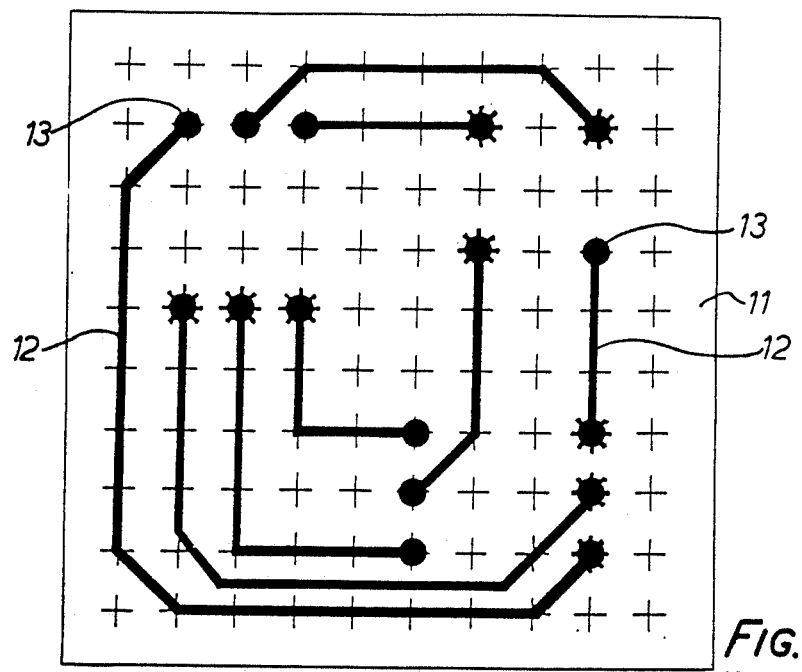
FIGS. 1A and 1B are respectively a diagrammatic "plan" view of a simple printed circuit board and a quarter scale plan view of a real board.

FIG. 1A shows, schematically, one side of a typical PCB. The board itself (11) is constructed from an insulating material, and carries a number of copper tracks (as 12) constituting the electrical connections between the components to be carried by the board. The leads of the components used in the circuit pass through holes (as 13) in the board, and are soldered to the tracks. Various points on the circuit are required to be connected to the ATE. Most conveniently, these connections are made via a bed-of-nails jig which contacts each of the required points by means of a spring-loaded pin. The possible contact points for the jig are shown by the grid of "+" overlaying the board; those where contact is desired are marked "*".

Figure 1B:
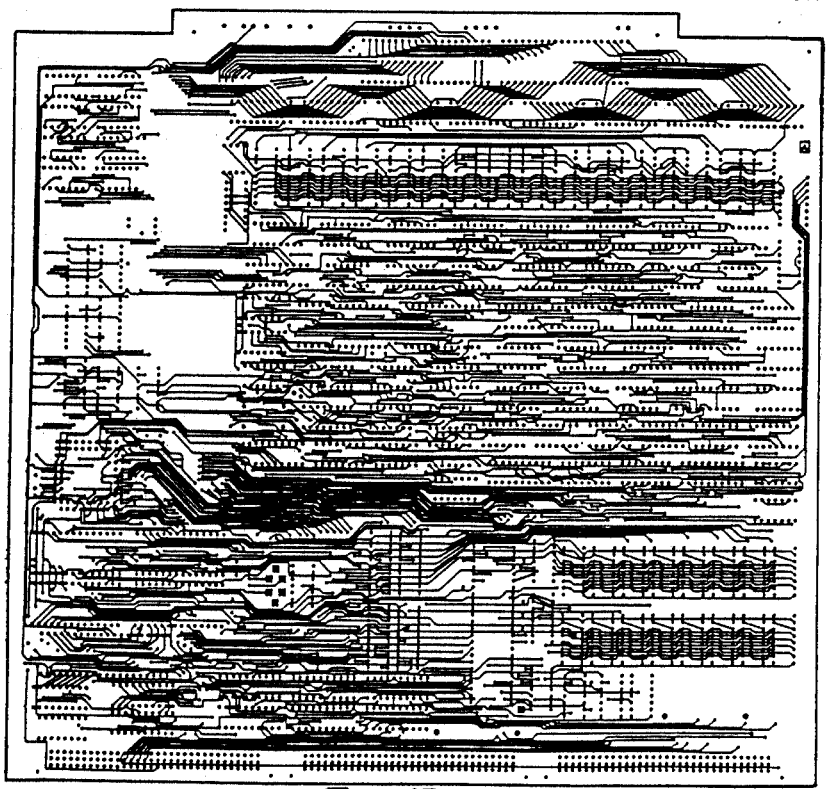

The complexity of a real board is shown in the quarter scale FIG. 1B. It will be apparent, without further comment, that the testing of such a board, loaded with active components, is a task fraught with difficulty!

One currently available bed-of-nails jig system is illustrated in FIG. 2. It consists of a field of pins (as 21) mounted in a framework (generally 22) such that the pins lie on a suitable matrix. The framework is here shown as top and bottom apertured guideplates (22t, 22b). The pins are supported by a platen (23), moveable up and down as shown by the double-headed arrow, via individual compression springs (as 24). By raising this platen all the pins have a raising force applied to them via their individual springs. The required pin selection is achieved by the use of an apertured blanking plate (25) which is in register with the pin bed and between it and the PCB under test. The plate is pre-drilled (to form the apertures, as 26) such that the required pins are allowed to rise and contact the PCB (not shown) whilst the non-required pins are held in their lowered position.

FIGS. 3A and B show, respectively, the use of clutch and valve mechanisms.

The basic clutch mechanism of FIG. 3A consists of a cylindrical metal rod (31) passing through a bore hole (32) in a metal block (33). The dimensions of the rod and bore hole are such that there exists a suitable gap (about 0.02 in, or 0.5 mm, in practice) between the rod and the bore wall for the complete circumference of the rod. This gap is filled with an ER fluid (not shown). An electrical connection is taken to the metal block (at 34) and to the rod (at 35). The rod is mechanically connected to a moveable platen (36) by means of a suitable spring (37).

The platen 36 may be raised and lowered (by means not shown) relative to the metal block 33. Normally, the rod will follow the motion of the platen, but when a voltage of about 1.5 Kv is applied between the block and the rod the ER fluid in the gap therebetween is made "solid", and the block and rod are locked together. Within the limits of the shear force obtained, no relative motion takes place. The rod can therefore be programmed to be up or down irrespective of the position of the platen, the relative movement of the rod and platen taking place in the spring 37.

The basic valve mechanism of FIG. 3B consists of a pin (301) the lower end (302) of which forms, or constitutes, a piston (303) sliding within the bore 32 of a metal block 33. Also projecting into the bore 32, but from the other end (the end opposed to the piston 303), is a pin-like central electrode plate (304). One electrical connection 34 is made to the block 33, and a second (35) is made to the pin plate 304. Filling the bore 32 and the spare either side (around pin 301 and electrode 304) is an ER fluid (not shown), and this may motionally be externally pumped (by pump 305) from side to side of the piston 303, so causing the piston, and the pin 301, to move up and down unless the ER fluid has been rendered "solid" by a voltage applied across the bore 32 between the block 33 and the electrode pin 304.

Figure 4:
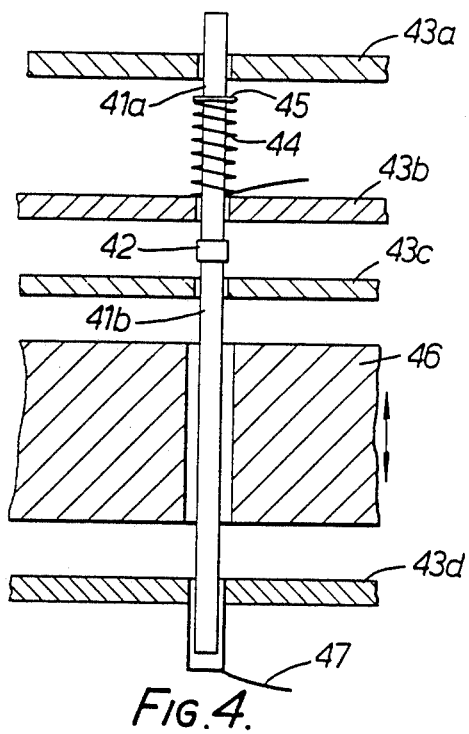
FIG. 4 is a diagrammatic view of another pin/clutch combination useful in an assembly of the invention.

FIG. 4 shows a more practical pin/clutch combination. The pin is a two-part object, a metal contact portion (41a) mounted on a metal non-contact portion (41b) by means of an insulating block (42). There are four apertured guideplates (43a, b, c and d) making up the framework, and these are in pairs near either end of the pin contact portion (43a, b) and the pin out-of-contact portion (43c, d). A pin return spring (44) is positioned between the upper guideplate pair, connected between the collar (45) on the pin and the lower of the pair's plates (43b), while between the lower guideplate pair (43c, d) is positioned a moveable apertured platen (46) in the form of a metal block; this block forms in addition the outer plate of the clutch, just as does the block 33 in the clutch mechanism of FIG. 3A.

The electrical connection to the pin upper portion 41a, which must be capable of carrying currents as high as about 0.5 A, and transmitting voltages as low as about 200 mv, is made via the spring 44. The required relative motion between the pin/rod and the framework is obtained by movement of the block 46 rather than of the bottom guideplate (as was the case in the FIG. 3A system). The electrical connection to the pin bottom portion 41b is made via a sliding contact (47).

Figure 5:
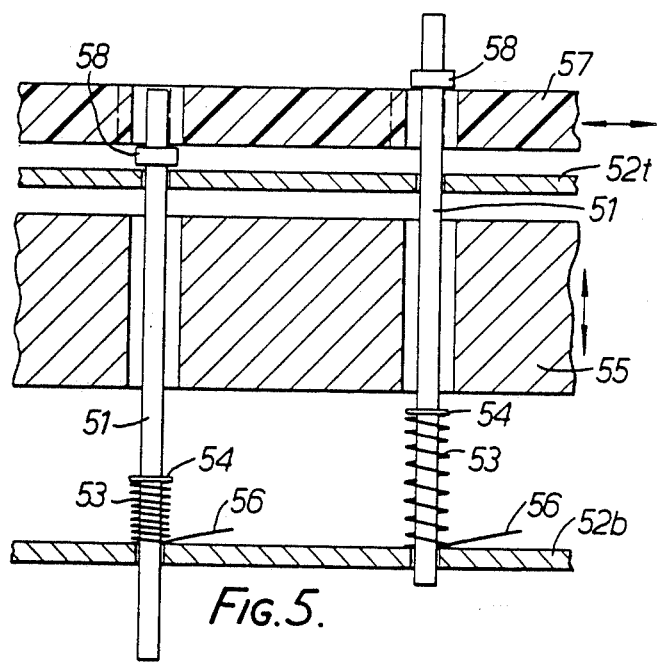
FIG. 5 is a diagrammatic view of yet another form of pin/clutch combination useful in an assembly of the invention.

FIG. 5 shows a more preferred practical implementation using a clutch mechanism. The principle of operation is much the same as before, but the addition of a mechanical lock brings a number of advantages.

The one-part pin (51) is mounted within the apertures of two framework guideplates (52t, 52b), and along its length between the two are a restoring spring (53), connected between a collar (54) on the pin and the lower guideplate 52b, and, above the spring, a moveable platen (55) in the form of a metal block that, like the block 46 in FIG. 4, also forms the clutch outer plate. The sole electrical connection (56) to the pin is via the spring 53.

This embodiment includes a mechanical lock, formed by a sideways moveable insulated apertured locking plate (57) positioned above the upper guideplate 52t and in register with the pins, engaging with a collar (58) near the contact (upper) end of each pin. The dimensions of the collar and locking plate apertures are such that the collar will pass therethrough provided the locking plate is fully in register (at the right end of its sideways movement, as shown, in heavy line), but *not* when the locking plate is only partly in register (at the left end of its sideways movement, as shown in dashed line).

As explained hereinbefore, the use of a mechanical pin locking system is advantageous in that the system only requires one connecting wire per pin, the pins are constructed from single metal rods, the minimum shear force required between the rod and the metal block walls is minimised (so that the stress voltage controlling the ER fluid clutch is minimised), and there is no possibility of the clutch high voltage control signals being applied either directly or indirectly to the PCB.

The operation of this system, starting with all pins lowered, the lock open, and the PCB raised away from the pin bed, is as follows:

(i) All the pin connections 56 are switched to the jig control electronics.
(ii) The high level control voltage signal is switched to the actuating platen 55.
(iii) Via the control electronics, the low level control signal voltage, preferably earth, is switched to all the pins 51 to be raised.
(iv) The platen 55 is then raised, so raising all the selected pins 51 by means of the activated ER fluid clutches formed only between the platen and those selected pins.
(v) The mechanical lock 57 is operated, thus locking in the up position all the raised pins 51.
(vi) The ER fluid control voltage is switched off.
(vii) The pin connections are switched away from the jig control electronics and to the ATE/Unit Under Test interface.
(viii) Finally, the PCB (not shown) is lowered into position so that the raised pins 51 make contact at the required points.

Figure 6:
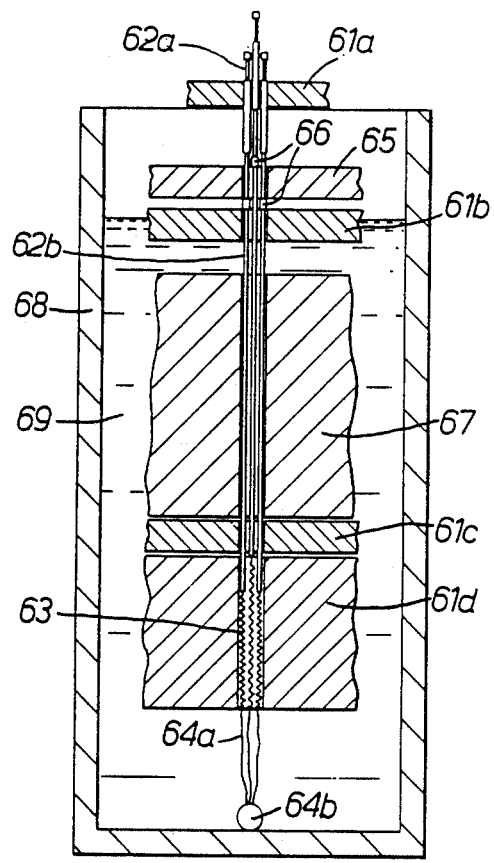
FIG. 6 is a part view, in elevational cross-section, through a test jig in accordance with the invention.
Figure 7:
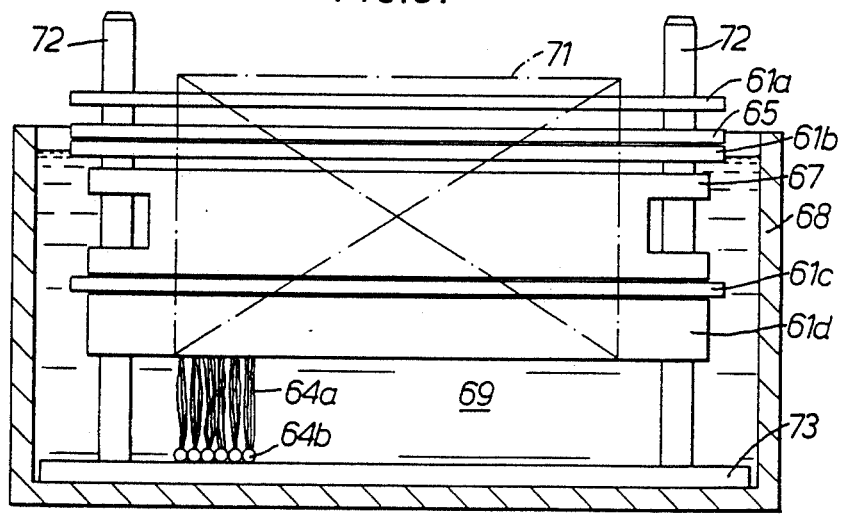
FIG. 7 is another elevational cross-section view through a test jig in accordance with the invention.

The general construction for an actual programmable bed-of-nails jig may be understood with reference to FIGS. 6 and 7.

The "working" parts shown in FIG. 6 are much like those in FIGS. 4 and 5. The framework has four apertured guide plates (61a, b, c and d) the bottom one of which is a base plate. The pins are in two linked portions—a contact, "probe", portion (62a) above a main, "push rod" portion (62b). Tension springs (as 63) hold each pin within the base plate (61d), and also provide the electrical connections to the control lines (as 64a) bundled in a cable form (64b). The mechanical locking system is the combination of sideways moveable locking plate (65) and pin collars (as 66), while a metal block platen (67) both "clutches" the pins and moves them up and down. The whole is positioned within a tank (68) filled, up to near the level of the locking plate 65, with the chosen ER fluid (69). Retention of the ER fluid in the gap between the two working surfaces of the clutch is achieved by this immersion of the assembly in a tank of the fluid such that the clutch mechanism is below the level of the fluid.

The size of the individual components is such that the pin centres can be on any pitch equal to or greater than 0.1 in (2.54 mm). The actual pin contact portions are standard, commercially-available spring-loaded 0.04 in (1 mm) diameter pins as used in the standard bed-of-nails test fixtures. The electrical contact between the two pin portions may be either a permanent (e.g., welded) or more desirably a pressure contact (the pressure contact is formed by the PCB under test bearing down on the pin head). The flexible connection to each bottom pin portion 62b is a light spring 63 some 1.97 in (50 mm) long when extended. The moving platen 67 is constructed, by any convenient manufacturing process, as a solid metal block bored with 0.08 in (2.1 mm) diameter holes. The thickness of the block sets the working length of the clutch mechanism, and is dependant upon the actual ER fluid, the level of stress voltage, and the actual force required to raise a pin. The working length required is normally about 3.15 in (80 mm). The clearance above the platen of 4.7 in (12 mm) allows this amount of vertical movement.

FIG. 7 illustrates a side elevation view of the complete assembly (the electro-mechanical actuators required to raise, and lower, the platen 67 and operate the lock are not shown). The boxed area (71) indicates the area of the pin field, and contains the pin/clutch assemblies as shown in FIG. 6. Four main pillars (as 72) provide the bearing surface for the platen 67, and position the insulated block 61d housing the flexible connections (64a, not shown), the three other guideplates (61a, b, and c), and the locking plate 65. The individual connections are bundled in groups, each group running in a separate cable form 64b on a base board (73).

I claim:
1. A bed-of-nails assmebly for use in a programmable bed-of-nails test access jig, and including
   a framework,
   a multiplicity of pins carried by the framework and positioned on a suitable grid, each pin being mounted for longitudinal movement between a first, in contact, position and a second, out of contact, position,
   pin displacement means associated with each pin, for urging the pin to move between the two positions, and displacement control means associated with each pin, for controlling the pin's movement when urged by the displacement means, wherein:

each pin has its own, individual, displacement control means, functionally separate from the control means of any other pin;

each individual pin displacement control means utilizes the electro rheological effect available from an electro rheological fluid to regulate pin movement; and wherein the displacement control means comprises a clutch including an inner push rod longitudinally movable within a hollow cylinder, the push rod being integral with a respective one of the pins, and wherein a gap is formed between the cylinder internal wall and the rod, which gap is filled with an electro rheological fluid.

2. An assembly as claimed in claim 1, wherein the multiplicity of pins is sufficient to provide the required number of pins at a required centre-to-centre spacing over the entire area of a board.

3. An assembly as claimed in claim 1, wherein the pins are thin elongated rods, moveable longitudinally between a first position, where they are in contact with a PCB, and a second position, where they are out of contact.

4. An assembly as claimed in claim 3, wherein each pin comprises a respective probe-like tip to make actual contact with a PCB under test.

5. An assembly as claimed in claim 1, wherein the pin consists of a cylindrical metal push-rod and the hollow cylinder is a bore hole in a metal block, and wherein the rod passes through the hole and electrical connections are taken to the block and the rod.

6. An assembly as claimed in claim 1, wherein each pin can be retained in position by purely mechanical means other than the clutch, and this mechanical means is a combination of a sideways slidable, insulated, apertured locking plate through which each pin projects and a collar on the pin dimensioned just to pass through the locking plate aperture and positioned on the pin so as to lie on one side of that aperture in a pin-unselected position but on another side in a pinselected position.

7. A bed-of-nails assembly for use in a programmable bed-of-nails test access jig, and including a framework, a multiplicity of pins carried by the framework and positioned on a suitable grid, each pin being mounted for longitudinal movement between a first, in contact, position and a second, out of contact, position, pin displacement means associated with each pin, for urging the pin to move between the two positions, and displacement control means associated with each pin, for controlling the pin's movement when urged by the displacement means, wherein:

each pin has its own, individual, displacement control means, functionally separate from the control means of any other pin;

each individual pin displacement control means utilizes the electro rheological effect available from an electro rheological fluid to regulate pin movement; and the framework is a rigid frame in which the pins can be mounted for longitudinal sliding movement, and consists of a rectangular base plate supporting columns themselves carrying an apertured upper guideplate which locates the pins while allowing them to slide up and down.

8. An assembly as claimed in claim 7, wherein there are four columns, one at each corner of the base plate.

9. A bed-of-nails assembly for use in a programmable bed-of-nails test access jig, and including a framework, a multiplicity of pins carried by the framework and positioned on a suitable grid, each pin being mounted for longitudinal movement between a first, in contact, position and a second, out of contact, position, pin displacement means associated with each pin, for urging the pin to move between the two positions, and displacement control means associated with each pin, for controlling the pin's movement when urged by the displacement means, wherein:

each pin has its own, individual, displacement control means, functionally separate from the control means of any other pin;

each individual pin displacement control means utilizes the electro rheological effect available from an electro rheological fluid to regulate pin movement; and the pin displacement means is in part combined with the displacement control means, to form a combination means which both moves, and controls the movement of, each pin against a restoring force provided by a spring connecting the pin to a spacially-fixed portion of a pin-supporting framework, and wherein the displacement means includes a platen that is moved to move the pins.

10. A bed-of-nails assembly for use in a programmable bed-of-nails test access jig, and including a framework, a multiplicity of pins carried by the framework and positioned on a suitable grid, each pin being mounted for longitudinal movement between a first, in contact, position and a second, out of contact, position, pin displacement means associated with each pin, for urging the pin to move between the two positions, and displacement control means associated with each pin, for controlling the pin's movement when urged by the displacement means, wherein:

each pin has its own, individual, displacement control means, functionally separate from the control means of any other pin;

each individual pin displacement control means utilizes the electro rheological effect available from an electro rheological fluid to regulate pin movement; and in order to retain the electro rheological fluid in place, the complete assembly is immersed in a tank of the electro rheological fluid such that control mechanisms are below the level of the fluid but the contact portions of the pins are above the level of the fluid.

11. A bed-of-nails assembly, comprising:

a tank to contain an electro rheologial fluid;

a conductive block having a plurality of bores therein, the bores being arranged in a grid pattern;

means for mounting the block in the tank so that the fluid enters the bores;

a plurality of pins, each extending into a respective bore and being slidable with respect to the block between first and second positions; and means for selectively immobilizing predetermined pins with respect to the block by establishing an electric field through the fluid in the respective bores.

12. A bed-of-nails assembly according to claim 11, further comprising a plurality of pistons, each being attached to a respective pin and being slidably disposed in a respective bore, and wherein the means for selectively immobilizing comprises a plurality of elongated electrodes, each extending into a respective bore, and conductors for applying a first potential to the block and for selectively applying a second potential to predetermined electrodes.

13. A bed-of-nails assembly according to claim 12, wherein the block has first and second sides, the bores extending from the first side to the second side, and further comprising pump means for pumping the fluid from one of the sides to the other of the sides.

14. A bed-of-nails assembly according to claim 11, further comprising a platen which is mounted for movement with respect to the block, and spring means for individually and resiliently supporting the pins on the platen, and wherein the means for selectively immobilizing comprises a plurality of conductors for applying a first potential to the block and for selectively applying a second potential to predetermined pins.

15. A bed-of-nails assembly according to claim 11, wherein the bores have parallel axes, and wherein the means for mounting the block comprises means for mounting the block for movement in a direction parallel to the axes of the bores, and wherein the means for selectively immobilizing comprises a plurality of conductors for applying a first potential to the block and for selectively applying a second potential to predetermined pins.

16. A bed-of-nails assembly according to claim 15, further comprising a framework having apertures therein through which the pins can extend, the block being movably positioned in the framework.

17. A bed-of-nails assembly according to claim 16, further comprising means for individually biassing the pins toward one of their first and second positions.

18. A bed-of-nails assembly according to claim 17, wherein the means for individually biassing comprises a plurality of springs each having a pair of ends, each spring being coiled around a respective pin and having one end thereof operatively connected to the respective pin, with the other end of the spring being positioned to abut the framework.

19. A bed-of-nails assembly according to claim 17, wherein each pin has a respective abutment thereon, and further comprising a locking plate having a plurality of openings through which the pins can extend, the locking plate being positioned adjacent the abutments and being movable in a direction perpendicular to the axes of the bores.

* * * * *